United States Patent
Seo et al.

(10) Patent No.: US 12,141,478 B2
(45) Date of Patent: Nov. 12, 2024

(54) MEMORY DEVICE, MEMORY MODULE INCLUDING THE MEMORY DEVICE, AND OPERATING METHOD OF MEMORY CONTROLLER

(71) Applicant: SAMSUNG ELECTRONICS CO., LTD., Suwon-si (KR)

(72) Inventors: Deokho Seo, Suwon-si (KR); Taekyeong Ko, Hwaseong-si (KR); Namhyung Kim, Seoul (KR); Daejeong Kim, Seoul (KR); Dohan Kim, Hwaseong-si (KR); Hoyoung Lee, Osan-si (KR); Insu Choi, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/932,734

(22) Filed: Sep. 16, 2022

(65) Prior Publication Data
US 2023/0137339 A1    May 4, 2023

(30) Foreign Application Priority Data

Oct. 29, 2021    (KR) .................. 10-2021-0147163

(51) Int. Cl.
*G06F 3/06*     (2006.01)
*H03M 13/00*   (2006.01)
*H03M 13/11*   (2006.01)

(52) U.S. Cl.
CPC .......... *G06F 3/0659* (2013.01); *G06F 3/0619* (2013.01); *G06F 3/0673* (2013.01); *H03M 13/1111* (2013.01); *H03M 13/611* (2013.01)

(58) Field of Classification Search
CPC .................................... G06F 3/0659
See application file for complete search history.

(56) References Cited

U.S. PATENT DOCUMENTS

| | | | | |
|---|---|---|---|---|
| 5,677,802 A * | 10/1997 | Saiki | ............... | G11B 20/1403 |
| 6,000,027 A | 12/1999 | Pawate et al. | | |
| 8,495,467 B1 | 7/2013 | Billing et al. | | |
| 9,842,021 B2 | 12/2017 | Halbert et al. | | |
| 10,037,244 B2 | 7/2018 | Chung et al. | | |
| 10,289,482 B2 * | 5/2019 | Kodera | ............... | G06F 11/1068 |
| 2001/0042230 A1 * | 11/2001 | Williams | ........... | G11B 20/1816 |

(Continued)

FOREIGN PATENT DOCUMENTS

| | | |
|---|---|---|
| KR | 1020130034522 | 4/2013 |
| KR | 1020170056823 | 5/2017 |

OTHER PUBLICATIONS

EESR Dated Feb. 16, 2023 In Corresponding EP Patent Application No. 22199977.4.

*Primary Examiner* — Joseph D Torres
(74) *Attorney, Agent, or Firm* — F. Chau & Associates, LLC

(57) ABSTRACT

A memory device includes a memory cell array including a normal region in which first data is stored and a parity region in which a parity bit for the data is stored, and an error correction code (ECC) engine. The ECC engine is configured to determine whether there is an error in the first data based on the first data and the parity bit, and to output, in response to receiving an uncorrected read command from a memory controller, second data in a state in which an error bit in the first data is not corrected.

12 Claims, 16 Drawing Sheets

(56) References Cited

U.S. PATENT DOCUMENTS

| | | | |
|---|---|---|---|
| 2011/0191648 A1* | 8/2011 | Suzuki | H03M 13/05 |
| | | | 714/752 |
| 2013/0080858 A1 | 3/2013 | Lee et al. | |
| 2015/0162100 A1 | 6/2015 | Motwani | |
| 2016/0034348 A1 | 2/2016 | Park et al. | |
| 2017/0060681 A1 | 3/2017 | Halbert et al. | |
| 2017/0132075 A1* | 5/2017 | Zastrow | G06F 11/1068 |
| 2017/0161144 A1 | 6/2017 | Reed et al. | |
| 2017/0308433 A1* | 10/2017 | Kwon | G11C 29/52 |
| 2019/0130991 A1* | 5/2019 | Son | G06F 11/1064 |
| 2020/0278906 A1* | 9/2020 | Bains | G06F 11/1072 |
| 2023/0176985 A1* | 6/2023 | Wen | G06F 11/3656 |
| | | | 710/110 |

* cited by examiner

FIG. 5

| | DQ0 | DQ1 | DQ2 | DQ3 | DQ4 | DQ5 | DQ6 | DQ7 |
|---|---|---|---|---|---|---|---|---|
| BL0 | 0 | 8 | 16 | 24 | 32 | 40 | 48 | 56 |
| BL1 | 1 | 9 | 17 | 25 | 33 | 41 | 49 | 57 |
| BL2 | 2 | 10 | 18 | 26 | 34 | 42 | 50 | 58 |
| BL3 | 3 | 11 | 19 | 27 | 35 | 43 | 51 | 59 |
| BL4 | 4 | 12 | 20 | 28 | 36 | 44 | 52 | 60 |
| BL5 | 5 | 13 | 21 | 29 | 37 | 45 | 53 | 61 |
| BL6 | 6 | 14 | 22 | 30 | 38 | 46 | 54 | 62 |
| BL7 | 7 | 15 | 23 | 31 | 39 | 47 | 55 | 63 |
| BL8 | 64 | 72 | 80 | 88 | 96 | 104 | 112 | 120 |
| BL9 | 65 | 73 | 81 | 89 | 97 | 105 | 113 | 121 |
| BL10 | 66 | 74 | 82 | 90 | 98 | 106 | 114 | 122 |
| BL11 | 67 | 75 | 83 | 91 | 99 | 107 | 115 | 123 |
| BL12 | 68 | 76 | 84 | 92 | 100 | 108 | 116 | 124 |
| BL13 | 69 | 77 | 85 | 93 | 101 | 109 | 117 | 125 |
| BL14 | 70 | 78 | 86 | 94 | 102 | 110 | 118 | 126 |
| BL15 | 71 | 79 | 87 | 95 | 103 | 111 | 119 | 127 |

| Function | Abbreviation | CS_n | CA Pins | | | | | | | | | | | | | |
|---|---|---|---|---|---|---|---|---|---|---|---|---|---|---|---|---|
| | | | CA0 | CA1 | CA2 | CA3 | CA4 | CA5 | CA6 | CA7 | CA8 | CA9 | CA10 | CA11 | CA12 | CA13 |
| Read | RD | L | H | L | H | H | H | BL*=L | BA0 | BA1 | BG0 | BG1 | BG2 | CID0 | CID1 | CID2 |
| | | H | C2 | C3 | C4 | C5 | C6 | C7 | C8 | C9 | C10 | V | H | V | V | CID3 |
| Read w/Auto Precharge | RDA | L | H | L | H | H | H | BL*=L | BA0 | BA1 | BG0 | BG1 | BG2 | CID0 | CID1 | CID2 |
| | | H | C2 | C3 | C4 | C5 | C6 | C7 | C8 | C9 | C10 | V | AP=L | V | V | CID3 |

MEMORY DEVICE, MEMORY MODULE INCLUDING THE MEMORY DEVICE, AND OPERATING METHOD OF MEMORY CONTROLLER

CROSS-REFERENCE TO RELATED APPLICATIONS

This application claims priority under 35 U.S.C. § 119 to Korean Patent Applications No. 10-2021-0147163, filed on Oct. 29, 2021 in the Korean Intellectual Property Office, the disclosure of which is incorporated by reference herein in its entirety.

TECHNICAL FIELD

Embodiments of the inventive concept relate to a memory device, and more particularly, to a volatile memory device, a memory module including the volatile memory device, and an operating method of a memory controller.

DISCUSSION OF RELATED ART

A memory used in a server may guarantee reliability, availability, and scalability (RAS), and an error detection and correction function is utilized to maintain data integrity. An error correction code (ECC) operation may be performed at a memory module level, and an on-die ECC technology that corrects errors in units of memory cells may be used in a memory chip. One error may be corrected through an on-die ECC operation (single-error correction, SEC).

An error that cannot be corrected through an on-die ECC operation may occur. For example, a case in which two errors occur is regarded as an error in a range in which RAS is not guaranteed. In addition, other errors may also occur due to an on-die ECC operation for correcting two errors. From the point of view of a host receiving miscorrected data, it may be difficult to distinguish whether an error in data is an error generated in a memory cell or an error caused by a malfunction of an on-die ECC operation.

SUMMARY

Embodiments of the inventive concept provide a memory device, a memory module including the memory device, and an operating method of a memory controller, the memory device outputting data in a state including an error bit by inactivating an on-die error correction code (ECC) operation.

According to an embodiment of the inventive concept, a memory device includes a memory cell array including a normal region in which first data is stored and a parity region in which a parity bit for the data is stored, and an ECC engine configured to determine whether there is an error in the first data, based on the first data and the parity bit. The ECC engine is further configured to output, in response to receiving an uncorrected read command from a memory controller, second data in a state in which an error bit in the first data is not corrected.

According to an embodiment of the inventive concept, an operating method of a memory controller includes transmitting a normal read command to a memory device, receiving, in response to the normal read command, miscorrected data generated by miscorrecting first data through an on-die error correction code (ECC) operation of the memory device, transmitting, to the memory device, a first uncorrected read command for receiving second data in a state in which an error bit in the first data is not corrected, and receiving the second data from the memory device.

According to an embodiment of the inventive concept, a memory module includes a printed circuit substrate and a plurality of memory chips mounted on the printed circuit substrate. Each of the plurality of memory chips includes a memory cell array that stores first data, and an error correction code (ECC) engine configured to correct an error bit in the first data and output the corrected data, in response to receiving a normal read command from a memory controller, and to output second data in a state in which the error bit in the first data is not corrected, in response to receiving an uncorrected read command from the memory controller. The ECC engine is further configured to transmit, in response to the normal read command, miscorrected data generated by miscorrecting the error bit in the first data to the memory controller, and to receive the uncorrected read command in response to the transmission of the miscorrected data.

BRIEF DESCRIPTION OF THE DRAWINGS

The above and other features of the inventive concept will be more clearly understood from the following detailed description taken in conjunction with the accompanying drawings, in which:

FIG. 5 shows an example of data according to an example embodiment;

FIG. 7 shows an example of a normal read command truth table of a memory device according to an example embodiment;

DETAILED DESCRIPTION OF THE EMBODIMENTS

Figure 1:
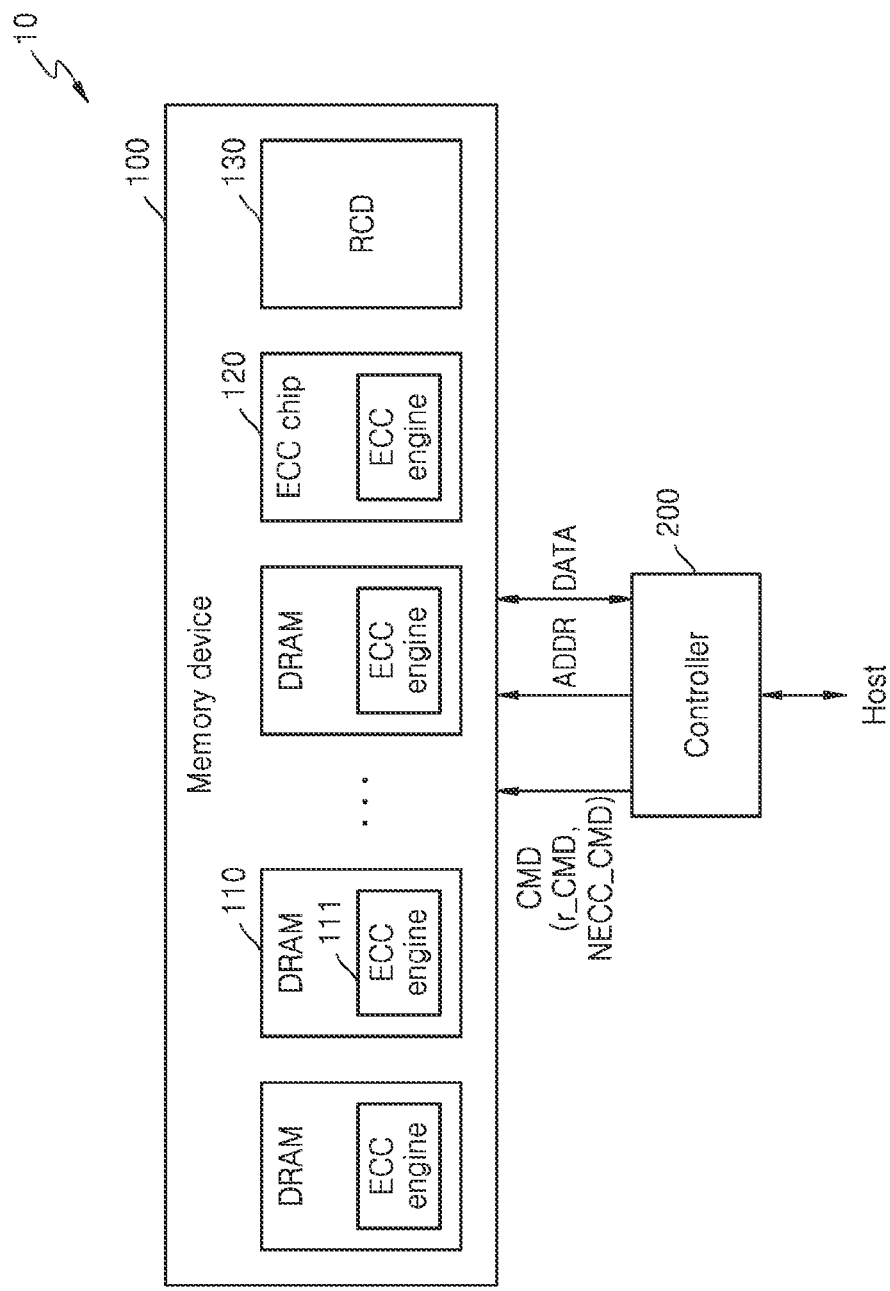
FIG. 1 is a block diagram of a storage system according to an example embodiment.

Hereinafter, embodiments of the inventive concept will be described in detail with reference to the accompanying drawings. Like reference numerals may refer to like elements throughout the accompanying drawings.

It will be understood that the terms "first," "second," "third," etc. are used herein to distinguish one element from another, and the elements are not limited by these terms. Thus, a "first" element in an embodiment may be described as a "second" element in another embodiment.

It should be understood that descriptions of features or aspects within each embodiment should typically be considered as available for other similar features or aspects in other embodiments, unless the context clearly indicates otherwise.

As used herein, the singular forms "a", "an" and "the" are intended to include the plural forms as well, unless the context clearly indicates otherwise.

FIG. 1 is a block diagram of a storage system 10 according to an example embodiment.

Referring to FIG. 1, the storage system 10 may include a memory device 100 and a memory controller 200. The memory controller 200 may control all operations of the storage system 10, and may control data exchange between a host and the memory device 100. For example, the memory controller 200 may control an operation of the memory device 100 by applying various types of commands to the memory device 100. The memory controller 200 may write or read data by controlling the memory device 100 according to a request of the host.

The memory controller 200 may transmit and receive an address ADDR, a command CMD, and data DATA (e.g., write data or read data) to and from the memory device 100 through a buffer chip 130. In an embodiment, the memory controller 200 may further transmit and receive a clock signal and a control signal to and from the memory device 100 through the buffer chip 130.

According to an embodiment, the memory controller 200 may transmit a normal read command r_CMD and an uncorrected read command NECC_CMD to the memory device 100. The normal read command r_CMD may be a command for reading corrected data, which may be generated as a result of correcting an error in data through an on-die error correction code (ECC) operation of the memory device 100. The uncorrected read command NECC_CMD may be a command for inactivating the on-die ECC operation from the memory device 100 and reading data. The normal read command r_CMD and the uncorrected read command NECC_CMD will be described in further detail below.

The memory device 100 may include a plurality of data chips 110, an ECC chip 120, and the buffer chip 130. According to an embodiment, the plurality of data chips 110 may each include dynamic random access memory (DRAM) such as, for example, double data rate synchronous dynamic random access memory (DDR SDRAM), low power double data rate (LPDDR) SDRAM, graphics double data rate (GDDR) SDRAM, or Rambus dynamic random access memory (RDRAM), or any volatile memory device utilizing an error correction operation.

The memory device 100 may be implemented as a memory module. In this case, the memory device 100 may include the plurality of data chips 110, the ECC chip 120, and the buffer chip 130, which are mounted on a printed circuit substrate. Connectors may be formed at a certain interval along one edge of a long side of the printed circuit substrate. When the memory module is inserted into a socket of another device, the connectors may come into contact with pins of a slot formed on the socket to be electrically connected thereto, and the command CMD, the address ADDR, a clock signal, the data DATA, etc. may be transmitted.

For example, when the memory module has the form of a registered dual in-line memory module (RDIMM), which is a module for a server, the memory module may further include a serial-presence detect (PSD) that stores information of the memory module in a non-volatile form. The SPD may include a non-volatile memory (e.g., electrically erasable programmable read-only memory (EEPROM)), and may include various types of information (e.g., the number of row and column addresses, a data width, the number of ranks, the memory density per rank, the number of memory devices, the memory density per memory device, etc.) about a data chip or information about the uncorrected read command NECC_CMD.

The plurality of data chips 110 may have a data bus width of 4 bits (×4), 8 bits (×8), 16 bits (×16), 32 bits (×32), etc. For example, an X8 memory device may transmit and receive data to and from the memory controller 200 through eight input/output pins.

The plurality of data chips 110 may perform a burst operation. A basic unit of a burst operation may be referred to as a burst length (BL). The BL may mean the number of pieces of data written or read during each burst operation. For example, when the plurality of data chips 110 operates at ×8 and a BL is 16, a length of data input/output by each of the plurality of data chips 110 through a unit operation may be data bus width (8)×BL (16)=128 bits. At this time, the length of data input/output by the memory device 100 through a unit operation may be a value obtained by multiplying 128 bits by the number of the plurality of data chips 110.

The plurality of data chips 110 may each include an ECC engine 111. The ECC engine 111 may also be referred to as an ECC engine circuit. The ECC engine 111 may perform an on-die ECC operation on data stored in each of the plurality of data chips 110. In an embodiment, the ECC engine 111 may correct a 1-bit error in one unit (e.g., one codeword). The ECC chip 120 may also include the ECC engine 111.

According to an embodiment, the plurality of data chips 110 may each omit an on-die ECC operation or ignore a result of an on-die ECC operation under the control of the memory controller 200. For example, in a data read operation, each of the plurality of data chips 110 may directly output data including an error to the memory controller 200 without correcting the error in the data.

When a hard failure occurs in at least one of the plurality of data chips 110, the ECC chip 120 may be used as a spare chip to replace the at least one data chip having a hard failure. For example, when a hard failure occurs in an arbitrary data chip, data stored in the arbitrary data chip may be copied to the ECC chip 120. Also, a mapping relationship between the arbitrary data chip and input/output pins may be released, and a new mapping relationship between the ECC chip 120 and the input/output pins may be formed.

Figure 2:
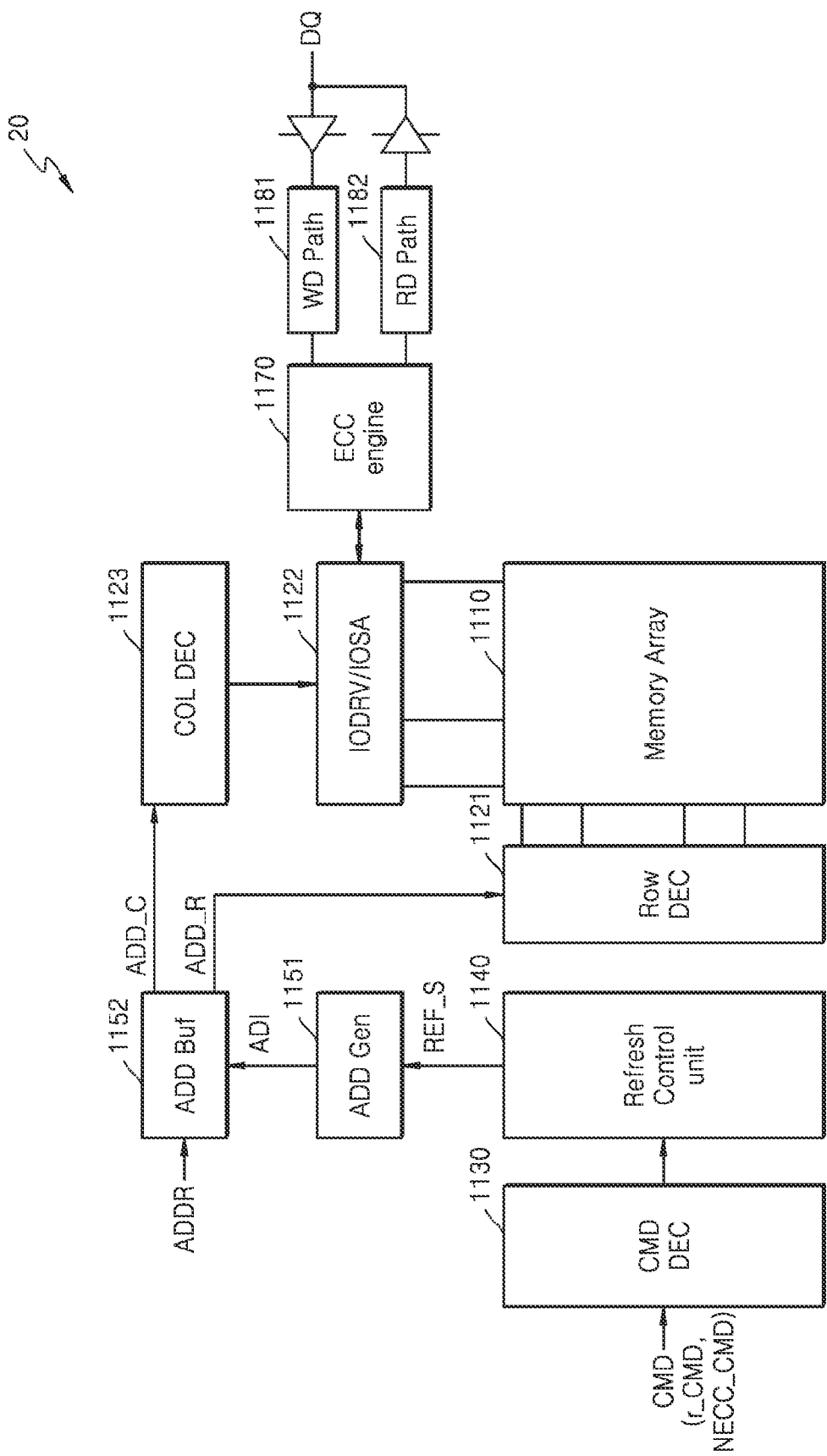
FIG. 2 is a block diagram of a data chip according to an example embodiment.

FIG. 2 is a block diagram of a data chip 20 according to an example embodiment. The data chip 20 of FIG. 2 may correspond to an embodiment of at least one of the plurality of data chips 110 of FIG. 1.

Referring to FIG. 2, the data chip 20 may include a memory array 1110 including a plurality of memory cells, a row decoder (Row DEC) 1121, a driver/sense amplifier (IODRV/IOSA) 1122, and a column decoder (COL DEC) 1123. In addition, in relation to the input/output of data, the data chip 20 may include an ECC engine 1170, a write data path unit (WD Path) 1181, and a read data path unit (RD Path) 1182. In addition, as a peripheral circuit for driving the memory array 1110, the data chip 20 may include a command decoder (CMD DEC) 1130, a refresh control circuit 1140, a refresh address generator (ADD Gen) 1151, and an address buffer unit (ADD Buf) 1152. The command decoder 1130 may also be referred to as a command decoder circuit.

The CMD DEC 1130 may generate one or more internal control signals for driving the data chip 20 by decoding the command CMD input from outside of the memory device 100 (e.g., from the memory controller 200 of FIG. 1). In addition, the address ADDR input from outside of the memory device 100 may be provided to the ADD Buf 1152, and a row address ADD_R for selecting a row and a column address ADD_C for selecting a column may be respectively provided to the Row DEC 1121 and the COL DEC 1123.

The CMD DEC 1130 may receive the normal read command r_CMD and the uncorrected read command NECC_CMD from outside of the memory device 100. The CMD DEC 1130 may read data from the memory array 1110 in response to the normal read command r_CMD, and generate a control signal to cause the ECC engine 1170 to perform an on-die ECC operation on the data. In this case, the CMD DEC 1130 may control corrected data generated by the ECC engine 1170 to be output to outside of the memory device 100 through the RD Path 1182.

The CMD DEC 1130 may read data from the memory array 1110 in response to the uncorrected read command NECC_CMD, and generate a control signal for omitting an operation of the ECC engine 1170. For example, the CMD DEC 1130 may control data to be output to outside of the memory device 100 through the IODRV/IOSA 1122 and the RD Path 1182.

The ECC engine 1170 may generate parity bits for data to be written to a partial region (e.g., a normal region of FIG. 3) of the memory array 1110. The parity bits generated by the ECC engine 1170 may be stored in a partial region (e.g., a parity region of FIG. 3) of the memory array 1110.

Data read from the normal region and parity bits read from the parity region may be sense-amplified by the IODRV/IOSA 1122 and stored in read data latches. Data stored in a read data latch may be transmitted to the ECC engine 1170. The ECC engine 1170 may detect and correct an error bit in data read from a normal region by using parity bits.

In an embodiment, the ECC engine 1170 may use various methods such as, for example, parity check, cyclic redundancy code check, checksum check, Hamming code, etc. The ECC engine 1170 may perform an ECC operation on a bad cell of the memory array 1110 in response to an ECC control signal. The ECC engine 1170 may perform an ECC operation adaptively to an X8 mode or an X4 mode of the data chip 20.

The refresh control circuit 1140 may control the ADD Gen 1151 to perform an auto-refresh operation in response to a refresh command, or may control the ADD Gen 1151 to perform a self-refresh operation in response to a self-refresh entry command. The ADD Gen 1151 may generate a refresh address corresponding to a memory cell row on which a refresh operation is to be performed. The ADD Gen 1151 may generate a refresh address with a refresh cycle defined in a standard of a volatile memory device.

The ADD Buf 1152 may receive the address ADDR including a bank address, the row address ADD_R, and the column address ADD_C from the memory controller 200 (see FIG. 1). In addition, the ADD Buf 1152 may provide the received bank address to bank control logic, provide the received row address ADD_R to the Row DEC 1121, and provide the received column address ADD_C to the COL DEC 1123.

Figure 3:
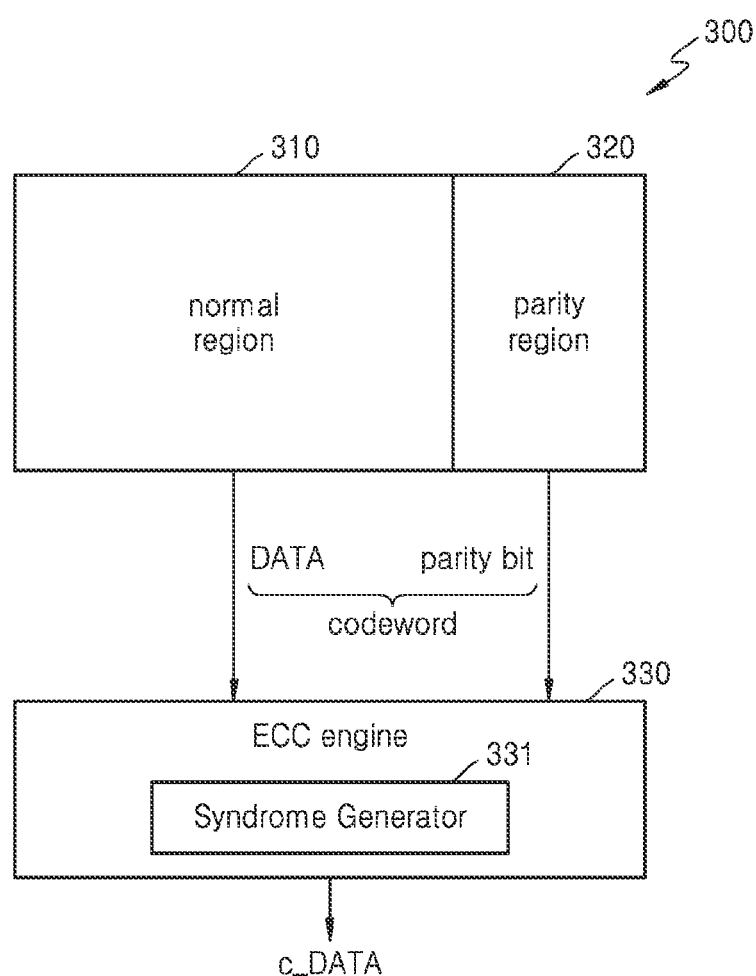
FIG. 3 is a block diagram of a portion of a data chip according to an example embodiment.

FIG. 3 is a block diagram of a portion a data chip according to an example embodiment. The block diagram of FIG. 3 shows an example of a portion of the memory array 1110 and the ECC engine 1170 of FIG. 2.

Referring to FIG. 3, a memory array 300 (e.g., the memory array 1110 of FIG. 2) may include a normal region 310 and a parity region 320. In a program operation, an ECC engine 330 may generate parity bits corresponding to data for error detection and error correction of data. Data may be stored in the normal region 310, and parity bits may be stored in the parity region 320.

The ECC engine 330 may read data DATA stored in the normal region 310 and a parity bit stored in the parity region 320 from the memory array 300 in a unit of codeword. For example, the data DATA having 128 bits and a parity bit having 8 bits may configure one codeword. The ECC engine 330 may include a syndrome calculator 331 that calculates syndrome data by using an XOR array operation based on a codeword. The ECC engine 330 may generate corrected data c_DATA by calculating a position of an error bit in the data DATA based on syndrome data and correcting the error bit.

Figure 4:
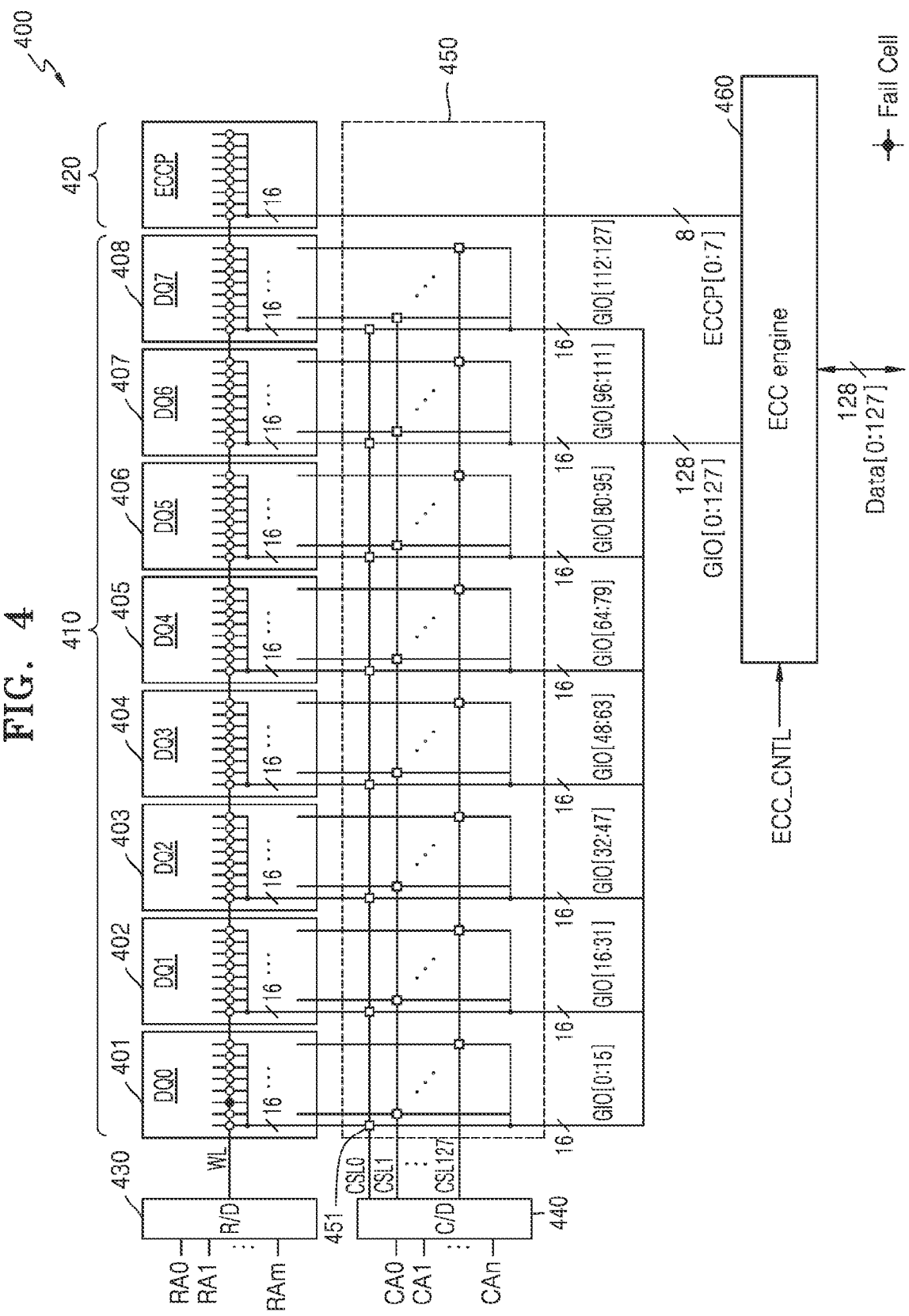
FIG. 4 is a block diagram of a portion of a data chip operating at 8 bits (×8), according to an example embodiment.

FIG. 4 is a block diagram of a portion of a data chip 400 operating at ×8, according to an example embodiment. A plurality of normal blocks 401 to 408 of FIG. 4 may correspond to an embodiment of the normal region 310 of FIG. 3, an ECC cell array 420 may correspond to an embodiment the parity region 320 of FIG. 3, and an ECC engine 460 may correspond to an embodiment of the ECC engine 330 of FIG. 3.

Referring to FIG. 4, the data chip 400 may support an X8 mode in which data of one unit of the normal region 310 of FIG. 3 is input/output through eight data input/output pins DQ0 to DQ7. The ECC engine 460 may perform an ECC operation to correct an error bit in data bits of one unit of the normal region 310.

In an embodiment, one unit of memory cells may include 128 memory cells, and one unit of data bits may include 128 bits. The normal region 310 may include the plurality of normal blocks 401 to 408. A plurality of memory cells arranged in rows and columns may be arranged in each of the plurality of normal blocks 401 to 408. Because data stored in the plurality of memory cells of each of the plurality of normal blocks 401 to 408 is input/output through the corresponding data input/output pins DQ0 to DQ7, hereinafter, the plurality of normal blocks 401 to 408 are referred to as DQ0 to DQ7 cell blocks 401 to 408, respectively.

A row of each of the DQ0 to DQ7 cell blocks 401 to 408 may include, for example, 8K word lines WL, and a column thereof may include, for example, 1K bit lines. Memory cells connected to intersections of the word lines WL and the bit lines BL may be configured as DRAM cells.

The word lines WL of the DQ0 to DQ7 cell blocks 401 to 408 may be accessed by row addresses RA0 to RAm, and the bit lines BL thereof may be accessed by column addresses CA0 to Can, in which each of m and n is a positive integer. The row addresses RA0 to RAm are decoded through a row decoder (R/D) 430, and the word line WL is selected by the decoded row addresses RA0 to RAm. The column addresses CA0 to CAn may be decoded through a column decoder (C/D) 440. The C/D 440 decodes the column addresses CA0 to CAn to generate column selection signals CSL0 to CSL127 which select the bit line BL. To support a BL indicating the maximum number of column locations capable of accessing the bit lines, the bit lines corresponding to the bit lines may be accessed simultaneously. For example, the BL may be 16.

Accordingly, the bit lines BL may be connected to a column selector 450 connected to each of 128 column selection signals CSL0 to CSL127, and sixteen bit lines BL may be simultaneously selected by one column selector 450. The column selector 450 may include sixteen switches, and is turned on by the column selection signals CSL0 to CSL127. The column selector 450 switched by 128 column selection signals CSL0 to CSL127 may include a column selection circuit.

In the DQ0 cell block 401, a plurality of memory cells may be connected to the word line WL accessed by the row addresses RA0 to RAm. Sixteen of the plurality of memory cells connected to the word line WL may be selected by the column selector 450 connected to the column selection signal CSL0 and connected to first data lines GIO[0:15]. The first data lines GIO[0:15] may include 16 bits.

In the DQ1 cell block 402, sixteen of the plurality of memory cells connected to the word line WL are selected by the column selector 450 connected to the column selection signal CSL0 and connected to second data lines GIO[16:31]. In each of the remaining DQ2 to DQ7 cell blocks 403 to 408, sixteen of the plurality of memory cells connected to the word line WL may be selected by the column selector 450 connected to the column selection signal CSL0 and connected to corresponding third to eighth data lines GIO[32:47] to GIO[112:127].

In a program operation, in the memory device 100 in FIG. 1, data Data[0:127] to be written to the DQ0 to DQ7 cell blocks 401 to 408 may be transmitted to the first to eight data lines GIO[0:127]. First to eighth burst data to be respectively written to the DQ0 to DQ7 cell blocks 401 to 408 through the first to eighth data lines GIO[0:127], respectively, that is, the data Data[0:127] having a total of 128 bits, may be received. The received 128-bit data Data[0:127] may be written to, for example, sixteen memory cells of each of the DQ0 to DQ7 cell blocks 401 to 408 selected by the column selector 450 connected to the column selection signal CSL0 among the plurality of memory cells connected to the word lines WL.

When there is one bad cell among the plurality of memory cells connected to the word line WL in one of the DQ0 to DQ7 cell blocks 401 to 408, the ECC cell array 420 may be used to relieve the bad cell. For example, among the memory cells of the DQ0 to DQ7 cell blocks 401 to 408 selected by the column selector 450 connected to the word line WL and the column selection signal CSL0, the DQ0 cell block 401 may have a bad cell. The bad cell may not be a bad cell of the DQ0 cell block 401, but rather, may be any one bad cell among the memory cells selected by the column selector 450 connected to the word line WL and the column selection signal CSL0 in the DQ1 to DQ7 cell blocks 402 to 408. The ECC cell array 420 may be controlled by the ECC engine 460, and may be used to detect and correct a bad cell in the DQ0 to DQ7 cell blocks 401 to 408.

The ECC cell array 420 may include, for example, 8K word lines WL, similar to the DQ0 to DQ7 cell blocks 401 to 408. The ECC cell array 420 may include, for example, eight bit lines, unlike the DQ0 to DQ7 cell blocks 401 to 408. Memory cells connected to intersections of the word lines WL and the bit lines BL of the ECC cell array 420 may also be configured as DRAM cells.

In the ECC cell array 420, the eight bit lines BL may be connected to parity data lines ECCP[0:7], respectively. Parity bits for data Data[0:127] stored in a bad cell in the DQ0 to DQ7 cell blocks 401 to 408 may be transmitted to the parity data lines ECCP[0:7]. The parity bits may be stored in and read from eight memory cells in the ECC cell array 420 through the parity data lines ECCP[0:7]. At this time, the eight memory cells of the ECC cell array 420 may be connected to the same word line WL as the word line WL of a bad cell.

The ECC engine 460 may detect and correct a bad cell in the DQ0 to DQ7 cell blocks 401 to 408 in response to an ECC control signal ECC_CNTL. In a write operation, the ECC engine 460 may generate parity bits for the data Data[0:127] received from a memory controller or a memory buffer in response to the ECC control signal ECC_CNTL, and transmit the generated parity bits to the parity data lines ECCP[0:7]. The parity bits on the parity data lines ECCP[0:7] may be stored in memory cells of the ECC cell array 420 connected to the word line WL of a bad cell.

In a read operation, the ECC engine 460 may receive data transmitted to the parity data lines ECCP[0:7] connected to the first to eight data lines GIO[0:127] in response to the ECC control signal ECC_CNTL. The data transmitted to the first to eighth data lines GIO[0:127] is data read from memory cells connected to the word line WL of a bad cell in the DQ0 to DQ7 cell blocks 401 to 408, and data transmitted to the parity data lines ECCP[0:7] includes parity bits read from memory cells connected to the corresponding word line WL in the ECC cell array 420.

According to an embodiment, the ECC engine 460 may detect and correct an error bit caused by a bad cell by using data transmitted to the first to eight data lines GIO[0:127] and the parity data lines ECCP[0:7] in response to a normal read command. The ECC engine 460 may receive data transmitted to the first to eight data lines GIO[0:127] and the parity data lines ECCP[0:7], generate syndrome data, calculate a position of a bad cell, that is, a position of an error bit, correct data corresponding to the position of the error bit, and output corrected data.

According to an embodiment, the ECC engine 460 may receive data transmitted to the first to eight data lines GIO[0:127] and the parity data lines ECCP[0:7] in response to an uncorrected read command, and may directly output data without performing (bypassing) an error correction operation using parity bits. Alternatively, an error correction operation using parity bits may be performed, but data including an error bit may be directly output instead of corrected data. A detailed operation of the ECC engine 460 with respect to an uncorrected read command is described below with reference to FIGS. 9 to 11.

FIG. 5 shows an example of data according to an example embodiment.

Referring to FIG. 5, each of the eight data input/output pins DQ0 to DQ7 may perform a burst operation based on a BL of 16. That is, each of the eight data input/output pins DQ0 to DQ7 may input/output 16-bit data. In this case, 128-bit data may be divided into four units of data. For example, data may be divided into four units of data (e.g., first to fourth units of data Q1 to Q4) based on the eight data input/output pins DQ0 to DQ7 and a BL.

For example, the first unit of data Q1 may correspond to the first to fourth data input/output pins DQ0 to DQ3 and upper eight positions BL0 to BL7 among sixteen BLs. For example, the second unit of data Q2 may correspond to the fifth to eighth data input/output pins DQ4 to DQ7 and the upper eight positions BL0 to BL7 among sixteen BLs. For example, the third unit of data Q3 may correspond to the first to fourth data input/output pins DQ0 to DQ3 and lower eight positions BL8 to BL15 among sixteen BLs. For example, the fourth unit of data Q4 may correspond to the fifth to eighth data input/output pins DQ4 to DQ7 and the lower eight positions BL8 to BL15 among sixteen BLs.

According to an embodiment, when there is one error bit in 128-bit data, the error bit may be corrected by an on-die ECC operation of an ECC engine. However, when there are two error bits in the 128-bit data in a particular state, the ECC engine may miscorrect two error bits. For example, three error bits may be generated as a result of an on-die ECC operation. When a memory controller receives data including three error bits, the memory controller may not determine which of the three error bits is generated due to miscorrection. In this case, it may be referred to that an undetectable error has occurred.

When two error bits respectively occur in the first unit of data Q1 and the second unit of data Q2, or when two error bits respectively occur in the third unit of data Q3 and the fourth unit of data Q4, miscorrection of an ECC engine may not occur.

However, for example, when there are two error bits in the first unit of data Q1, the ECC engine corrects the corresponding error bits, so that miscorrected data may be generated in the third or fourth unit of data Q3 or Q4. For example, when there are two error bits in the third unit of data Q3, the ECC engine corrects the corresponding error bits, so that miscorrected data may be generated in the first or second unit of data Q1 and Q2. Herein, a case in which an on-die ECC operation is normally performed on one error bit is described. However, embodiments of the inventive concept are not limited thereto.

When a memory controller and/or a host receives miscorrected data, an original error bit, which is in a state before the occurrence of miscorrection, may not be checked only with the received miscorrected data. Accordingly, according to an embodiment, to reduce the occurrence of an ECC engine miscorrecting an error bit, an on-die ECC operation of the ECC engine may be inactivated as necessary. That is, the memory controller and/or the host may directly check an error bit by obtaining original data in a state in which an error bit is not corrected and corrected data.

Figure 6:
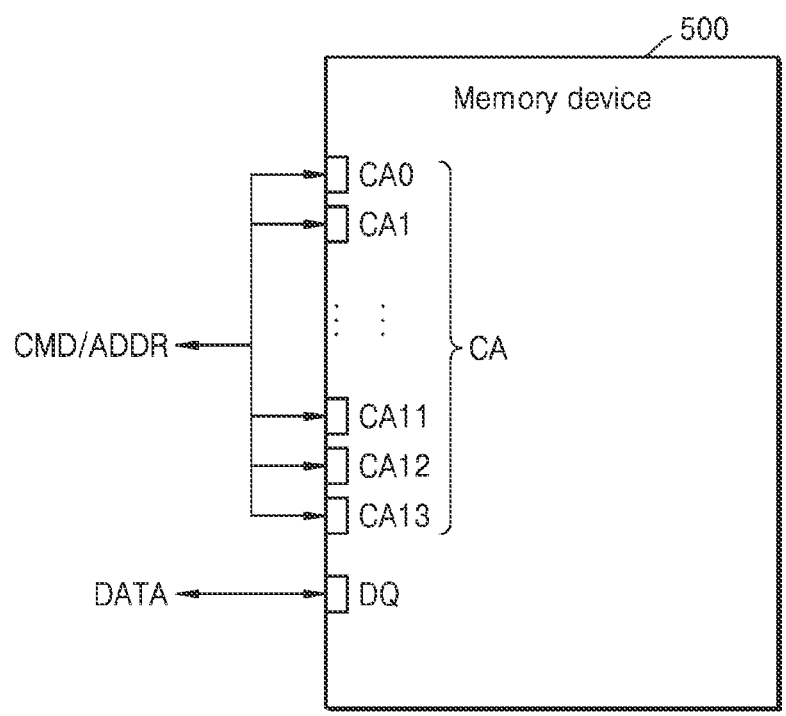
FIG. 6 shows an example of input/output pins of a memory device according to an example embodiment.

FIG. 6 shows an example of input/output pins of a memory device 500 according to an example embodiment, and FIG. 7 shows an example of a normal read command truth table of a memory device according to an example embodiment.

Referring to FIG. 6, the memory device 500 may include a plurality of command/address pins CA0 to CA13 and a plurality of data input/output pins DQ. Although only one data/output pin DQ is illustrated in FIG. 6, this is for convenience of illustration, and as described above, the memory device 500 may include eight data input/output pins according to an embodiment.

According to an embodiment, a memory controller may generate an uncorrected read command to inactivate an on-die ECC function of the memory device 500. The uncorrected read command may use command/address pins used in a read command, and may additionally use don't care pins which are not used in a read command.

Referring to FIG. 7, an uncorrected read command may be distinguished from a read command by setting a logic level of at least one of ninth, eleventh, and twelfth command/address pins CA9, CA11, and CA12. As an example, a memory controller may generate an uncorrected read command by additionally using don't care pins in addition to a combination of command/address pins of a read command performing an auto-precharge function. The generated uncorrected read command may inactivate an on-die ECC operation of the memory device 500 and activate an auto-precharge operation. The don't care pins used to generate an uncorrected read command in FIG. 7 is not limited to command/address pins.

Figure 8:
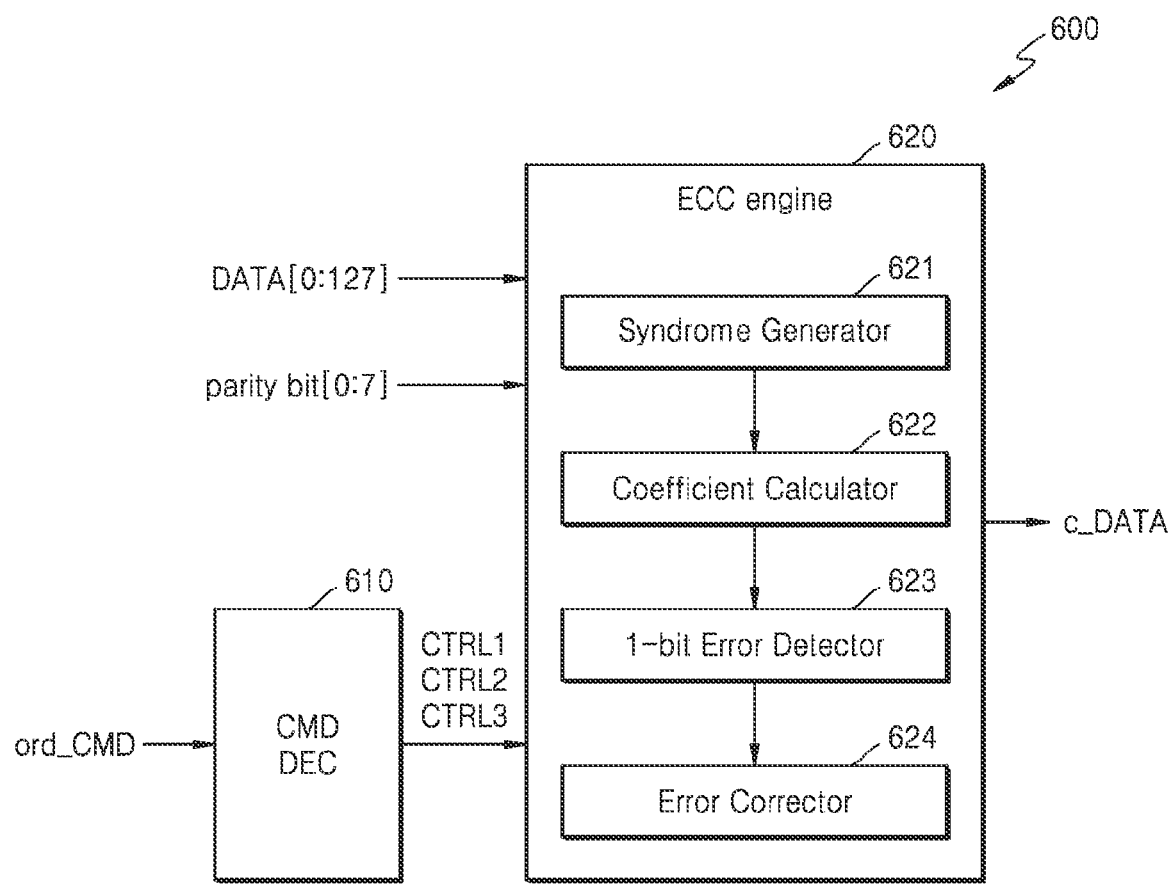
FIG. 8 is a block diagram of an error correction code (ECC) engine according to an example embodiment.

FIG. 8 is a block diagram of an ECC engine 620 according to an example embodiment.

Referring to FIG. 8, the ECC engine 620 may correct an error bit by using data DATA[0:127] read from memory cells including a bad cell through first to eighth data lines (e.g., GIO[0:127] of FIG. 4) and parity bits parity bit[0:7] transmitted to parity data lines (e.g., ECCP[0:7]), and may perform an ECC decoding operation of outputting corrected data c_DATA.

The ECC engine 620 may include a syndrome generator 621, a coefficient calculator 622, a 1-bit error detector 623, and an error corrector 624. The syndrome generator 621 may also be referred to as a syndrome generator circuit. The syndrome generator 621 receives the data DATA[0:127] having 128 bits and the parity bits parity bit[0:7] and generates syndrome data by using an XOR array operation. The coefficient calculator 622 may calculate a coefficient of an error position equation by using the syndrome data. At the same time, the 1-bit error detector 623 calculates a position of an error bit by using the syndrome data. The error position equation may be an equation based on a reciprocal of an error bit. The error corrector 624 determines a position of an error bit based on a detection result of the 1-bit error detector 623. The error corrector 624 may correct an error by inverting a logic value of a bit in which the error occurs among the 128-bit data DATA[0:127] according to determined position information of the error bit, and output the corrected data c_DATA.

According to an embodiment, as an uncorrected read command NECC_CMD is received from a memory controller, a CMD DEC 610 may generate a control signal that inactivates some operations of the ECC engine 620, for example, at least one of first to third control signals CTRL1, CTRL2, and CTRL3. For example, each of the first to third control signals CTRL1, CTRL2, and CTRL3 may inactivate an operation of at least one of the syndrome generator 621, the coefficient calculator 622, the 1-bit error detector 623, and the error corrector 624 of the ECC engine 620, or may bypass or ignore a result of an operation of at least one of the syndrome generator 621, the coefficient calculator 622, the 1-bit error detector 623, and the error corrector 624 of the ECC engine 620. The ECC engine 620 may directly output the data DATA[0:127] including an error bit instead of the corrected data c_DATA by receiving at least one of the first to third control signals CTRL1, CTRL2, and CTRL3.

Figure 9:
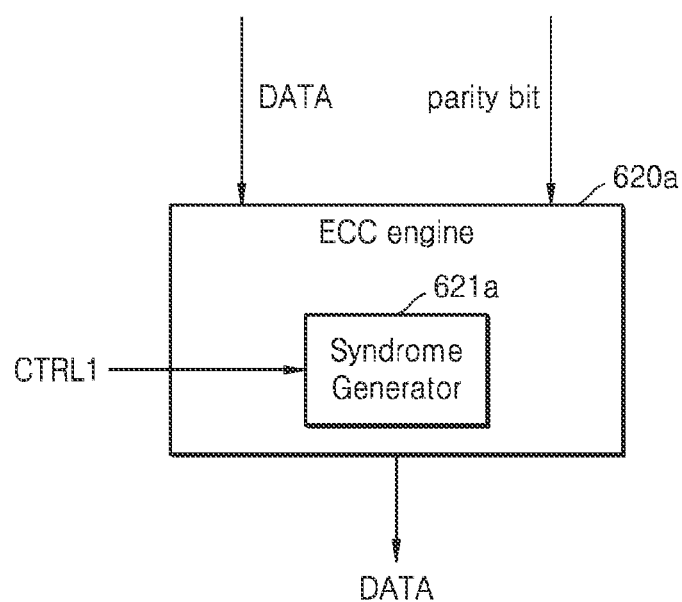
FIGS. 9 to 11 each show an example of an operation of an ECC engine according to an example embodiment.
Figure 10:
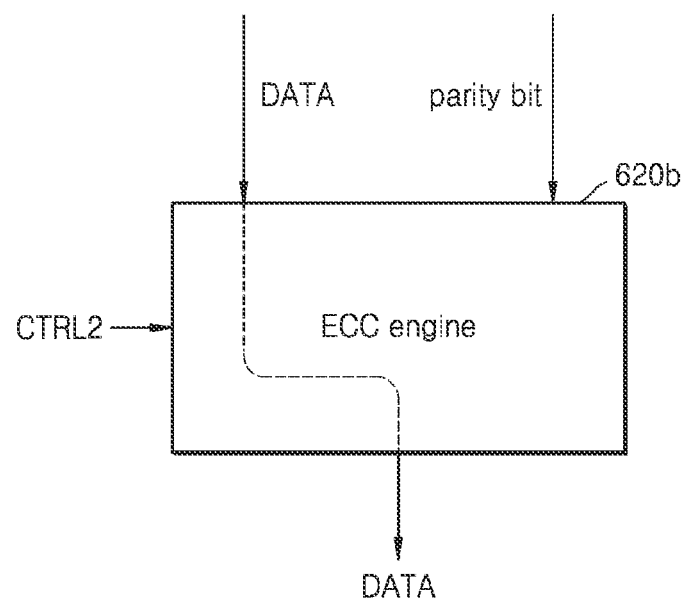
Figure 11:
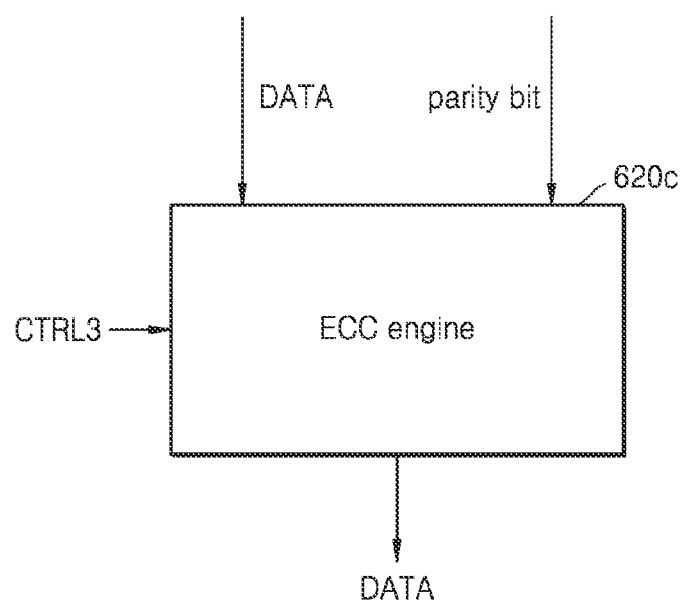

FIGS. 9 to 11 show an example of an operation of an ECC engine according to an example embodiment.

Referring to FIG. 9, a syndrome generator 621a of an ECC engine 620a may calculate syndrome data based on data DATA and a parity bit. A length of the syndrome data may be equal to a length of the parity bit. The syndrome data may include information about an error bit in the data DATA. For example, a position of an error bit in the data DATA may be checked based on the syndrome data.

As the ECC engine 620a receives the first control signal CTRL1 from the CMD DEC 610 (see FIG. 8), the ECC engine may substitute all of the syndrome data generated by the syndrome generator 621a with a first value. For example, the first value may be 0. The syndrome data only including 0 may mean that there is no error bit in the data DATA. As the syndrome data is substituted with 0, the ECC engine 620a may determine that there is no error bit in the data DATA and may directly output the data DATA.

Referring to FIG. 10, as an ECC engine 620b receives the second control signal CTRL2 from the CMD DEC 610, the ECC engine 620b may bypass or omit operations of the syndrome generator 621, the coefficient calculator 622, the 1-bit error detector 623, and the error corrector 624. That is, an on-die ECC operation of the ECC engine 620b may be omitted, and the data DATA may be directly output.

Referring to FIG. 11, as an ECC engine 620c receives the third control signal CTRL3 from the CMD DEC 610, the ECC engine 620c may ignore a result generated by an on-die ECC operation of the ECC engine 620c. For example, the ECC engine 620c may perform all of the operations described above with reference to FIG. 8, but the data DATA may be output instead of the corrected data c_DATA (in FIG. 8) generated as a result of the operations.

Figure 12A:
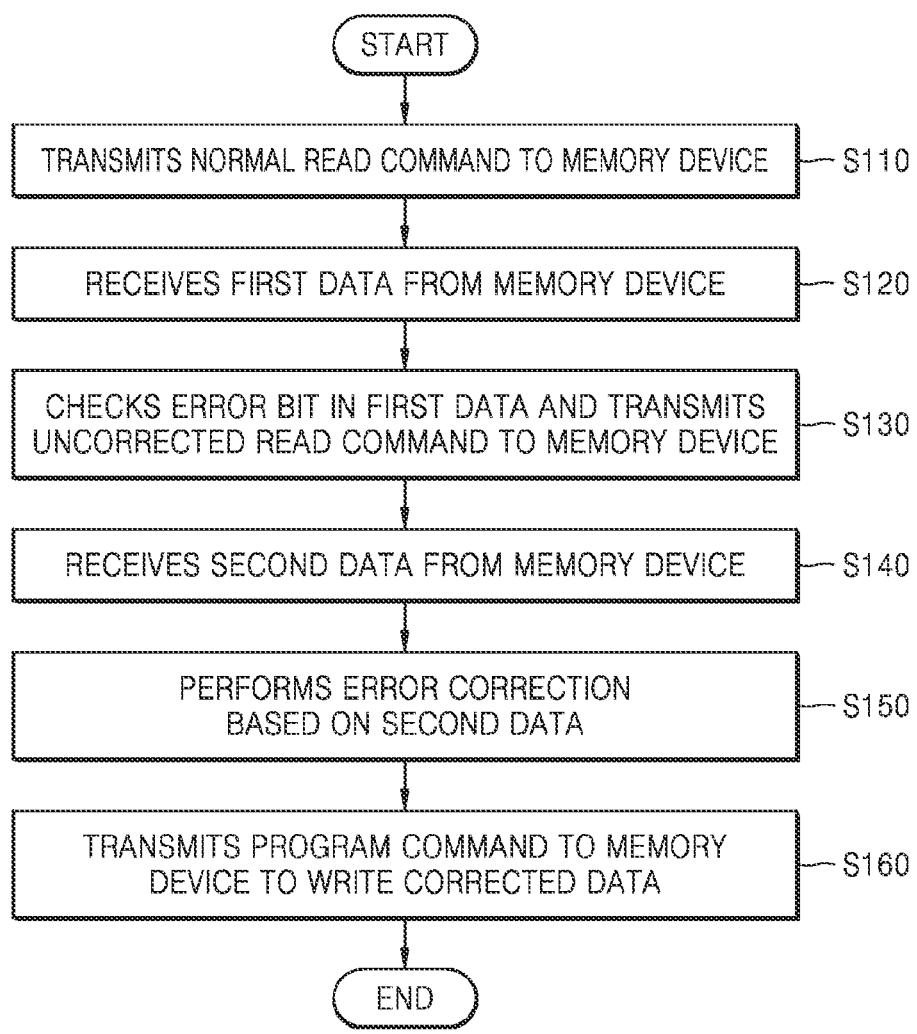
FIGS. 12A and 12B are flowcharts each illustrating a read-retry operation according to an example embodiment.
Figure 12B:
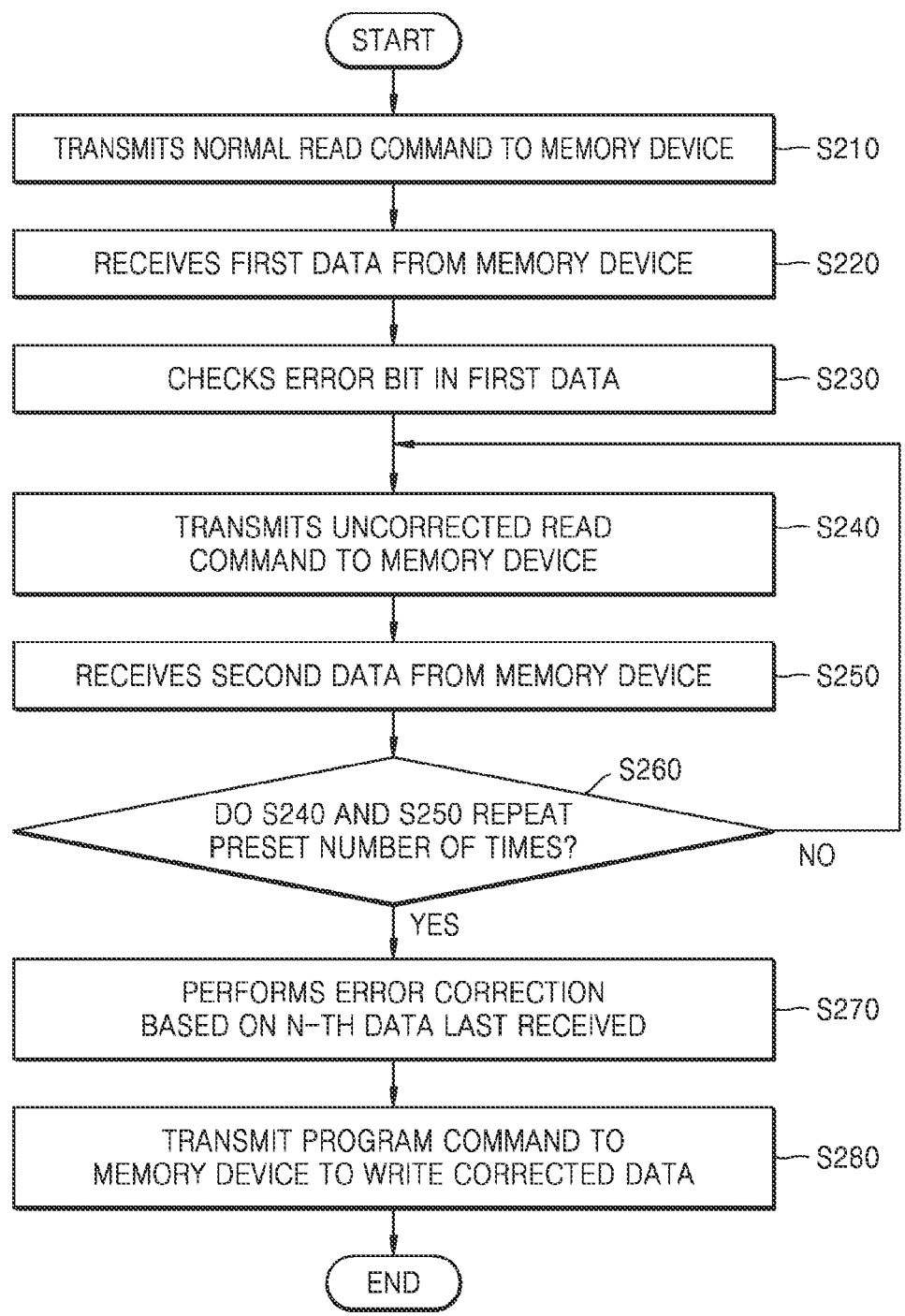

FIGS. 12A and 12B are flowcharts each illustrating a read-retry operation according to an example embodiment. When a certain time elapses after data is programmed to a memory device, the cell resistance distribution of data stored in the memory device may change. Accordingly, when a read operation of data using a read voltage having a first level fails, the read operation may be performed again by using a read voltage having a second level different from the first level. A second read operation is referred to as a read-retry operation.

According to an embodiment, a memory controller may receive first data including an error through a first read operation and receive second data from a memory device through a read-retry operation that is a second read operation. At this time, the second data may refer to original data in which an error is not corrected by the memory device, as well as data which is determined that does not include an error (e.g., as the error is completely corrected). When the memory controller performs a read-retry operation, the memory controller may transmit an uncorrected read command to the memory device to receive original data in which an error is not corrected by the memory device. Referring to FIG. 12A, in operation S110, a memory controller may transmit a normal read command to a memory device. For example, the normal read command may activate an on-die ECC operation of the memory device. In operation S120, the memory controller may receive first data from the memory device. For example, the first data may include data in which an error is corrected by the memory device, or data which is miscorrected through an on-die ECC operation as described above with reference to FIG. 5.

In operation S130, the memory controller may check an error bit in the first data and transmit an uncorrected read command to the memory device. In operation S140, the memory controller may receive second data from the memory device. The second data may include an error bit and may mean original data on which an error correction operation is not performed by the memory device.

In operation S150, the memory controller may perform an error correction operation based on the second data. For example, when the original data, that is, the second data, includes two or more error bits, the first data received in operation S120 may include more error bits according to an error correction operation of the memory device. Accordingly, the memory controller may check an error bit miscorrected by the memory device based on the second data on which the on-die ECC operation is not performed, and may generate corrected data by correcting the miscorrected error bit. In an embodiment, the memory controller may transmit the second data to a host. At this time, the host may generate corrected data. In operation S160, the memory controller may write the corrected data to the memory device.

According to an embodiment, the memory controller may generate an uncorrected read command to directly manage an error that the memory device may not correct. Accordingly, an error that may not be corrected by an on-die ECC operation may be corrected at a system level of the memory controller and/or the host.

According to an embodiment, the memory controller may perform a plurality of read operations. For example, the memory controller may receive first to n-th data from the memory device by performing n times of read operations, in which n is a positive integer. At this time, the memory controller may perform an error correction operation based on any one piece of the first to n-th data. For example, the memory controller may repeatedly perform a read-retry operation to check whether an error bit of the first data is due to a defect that has occurred inside the memory device or a defect that has occurred in an operation of transmitting the first data from the memory device to the memory controller.

In operation S210, the memory controller may transmit a normal read command to the memory device. In operation S220, the memory controller may receive first data from the memory device. In operation S230, the memory controller may check an error bit in the first data. As an error is in the first data, the memory controller may transmit an uncorrected read command to the memory device in operation S240, and may receive second data from the memory device in operation S250. In operation S260, the memory controller may repeat operations S240 and S250 a certain number of times. When the repetition of operations S240 and S250 is completed, the memory controller may perform an error correction operation based on the last data received from the memory device, for example, the n-th data, in operation S270. In operation S280, the memory controller may program a command to write corrected data to the memory device.

Figure 13:
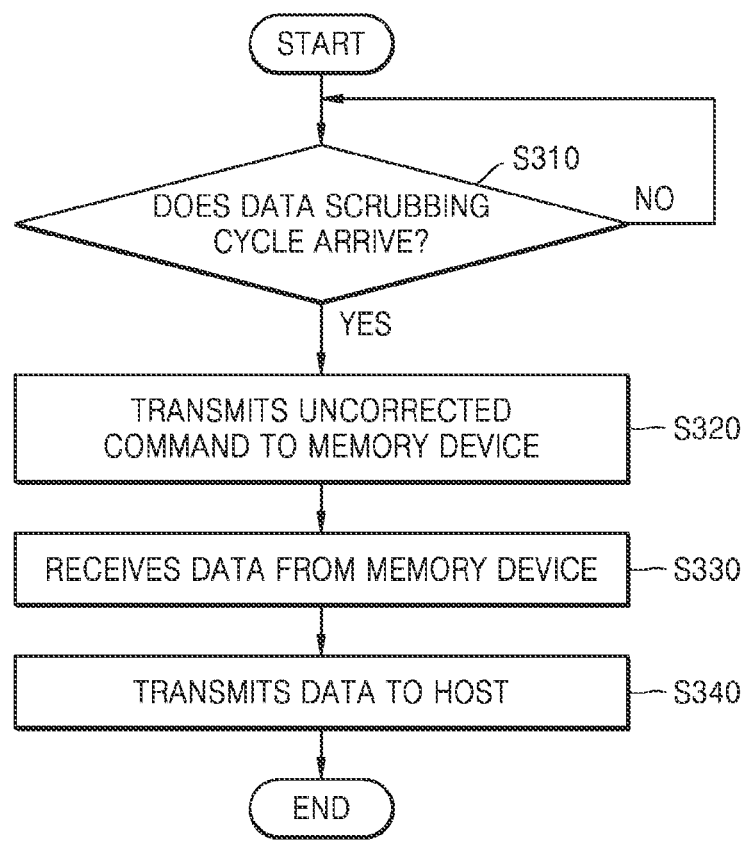
FIG. 13 is a flowchart illustrating a data scrubbing operation according to an example embodiment.

FIG. 13 is a flowchart illustrating a data scrubbing operation according to an example embodiment. A memory device may scrub all data stored in a memory array within a certain time, and check whether there is an error in the data to generate error information and transmit the error information to a memory controller. An operation of the memory device may be referred to as an error check-and-scrub (ECS) operation. To this end, the memory device may include a plurality of modules configured to read a certain portion of the memory array at regular cycles, check whether the read data includes an error, correct the error, and rewrite corrected data. According to an embodiment, as the memory controller or the host performs a patrol scrub operation by using an uncorrected read command, the memory device does not perform an ECS operation.

As a data scrubbing cycle arrives in operation S310, the memory controller may transmit an uncorrected read command to the memory device in operation S320. For example, the data scrubbing cycle may mean a cycle of a patrol scrub operation. For example, the memory device may inactivate an error correction operation for data and directly transmit original data in response to the uncorrected read command. The memory controller may receive data from the memory device in operation S330 and transmit the received data to the host in operation S340. The data scrubbing operation may be performed on all data stored in the memory array of the memory device within a preset period. That is, the memory controller may read data stored in the memory array every first cycle, and read all data stored in the memory array in the first cycle.

As the memory controller and/or the host receives data, error information of the memory array in the memory device may be directly checked and managed. Thereafter, the memory controller and/or the host may check whether there is an error in the data, correct the error, and write the corrected data back to the memory device.

Figure 14:
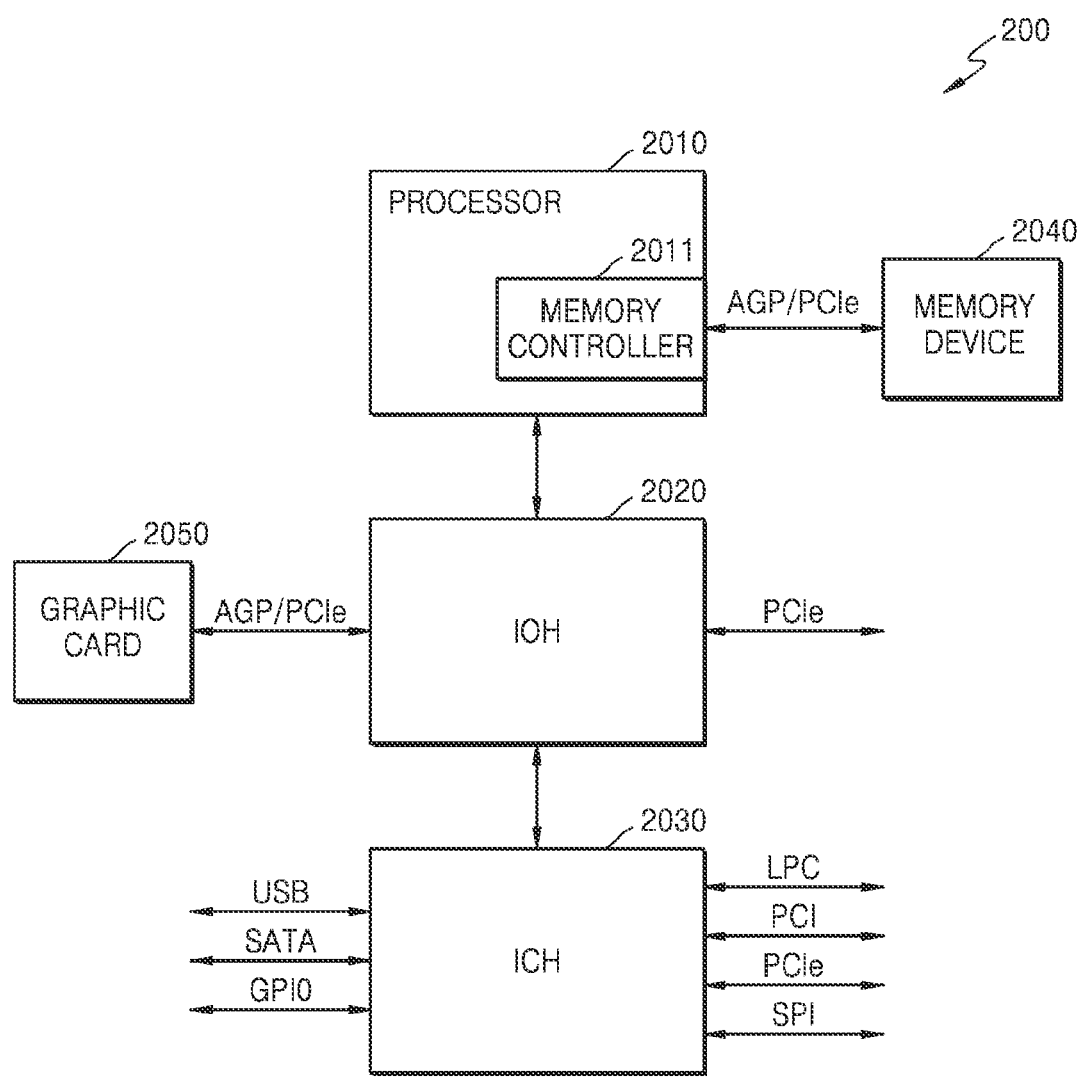
FIG. 14 is a block diagram illustrating an example in which a memory device according to an example embodiment is applied to a computing system.

FIG. 14 is a block diagram illustrating an example in which a memory device 2040 according to an example embodiment is applied to a computing system 200.

Referring to FIG. 14, the computing system 200 includes a processor 2010, an input/output hub (IOH) 2020, an input/output controller hub (ICH) 2030, the memory device 2040, and a graphics card 2050. For example, the computing system 200 may be any computing system, such as a personal computer (PC), a server computer, a workstation, a laptop, a mobile phone, a smartphone, a personal digital assistant (PDA), a portable multimedia player (PMP), a digital camera, a digital television (TV), a set-top box, a music player, a portable game console, a navigation system, etc.

The processor 2010 may execute various computing functions, such as particular calculations or tasks. For example, the processor 2010 may be a microprocessor or a central processing unit (CPU). According to an embodiment, the processor 2010 may include one single core or a plurality of processor multi-cores. For example, the processor 2010 may include a dual-core, a quad-core, a hexa-core, etc. Although FIG. 14 illustrates the computing system 200 including one processor 2010, embodiments of the inventive concept are not limited thereto. For example, according to an embodiment, the computing system 200 may include a plurality of processors. Also, according to an embodiment, the processor 2010 may further include a cache memory located inside or outside thereof.

The processor 2010 may include a memory controller 2011 that controls an operation of the memory device 2040. The memory controller 2011 in the processor 2010 may be referred to as an integrated memory controller (IMC). According to an embodiment, the memory controller 2011 may be in the IOH 2020. The IOH 2020 including the memory controller 2011 may be referred to as a memory controller hub (MCH).

The processor 2010, the memory controller 2011, and the memory device 2040 may respectively correspond to the host, the memory controller, and the memory device, which are described above with reference to FIGS. 1 to 13. According to an embodiment, the processor 2010 may directly manage an error which may not be corrected through an on-die ECC operation, and the processor 2010 may generate an uncorrected read command for inactivating the on-die ECC operation of the memory device 2040 to prevent the generation of an error which may not be detected through the on-die ECC operation.

The memory device 2040 may perform an on-die ECC operation for correcting an error of data stored in a memory array, and may omit the on-die ECC operation in response to an uncorrected read command. As a result, the memory device 2040 may output original data in a state in which an error is not corrected to the memory controller 2011. As the processor 2010 may directly manage original data and error information, the generation of an error which may not be detected due to miscorrection of the memory device 2040 may be prevented. In addition, because the processor 2010 performs an ECS operation instead of the memory device 2040, the chip overhead of the memory device 2040 may be reduced by removing modules for performing the ECS operation in the memory device 2040.

The IOH 2020 may manage data transmission between devices such as the graphics card 2050 and the processor 2010. The IOH 2020 may be connected to the processor 2010 through various interfaces. For example, the IOH 2020 and the processor 2010 may be connected to each other through interfaces of various standards, such as a front side bus (FSB), a system bus, HyperTransport, lighting data transport (LDT), QuickPath Interconnect (QPI), a common system interface, Peripheral Component Interface-Express (PCIe), etc. Although FIG. 14 illustrates the computing system 200 including one IOH embodiments of the present inventive concept are not limited thereto. For example, according to an embodiment, the computing system 200 may include a plurality of IOHs.

The IOH 2020 may provide various interfaces with devices. For example, the IOH 2020 may provide an accelerated graphics port (AGP) interface, PCIe, a communications streaming Architecture (CSA) interface, etc.

The graphics card 2050 may be connected to the IOH 2020 through AGP or PCIe. The graphics card 2050 may control a display device for displaying an image. The graphics card 2050 may include an internal processor for processing image data, and an internal semiconductor memory device. According to an embodiment, the IOH 2020 may include a graphics device inside the IOH 2020 together with the graphics card 2050, outside the IOH 2020, or may replace the graphics card 2050. The graphics device in the IOH 2020 may be referred to as integrated graphics. In addition, the IOH 2020 including a memory controller and a graphics device may be referred to as a graphics and memory controller hub (GMCH).

The ICH 2030 may perform data buffering and interface arbitration so that various system interfaces operate efficiently. The ICH 2030 may be connected to the IOH 2020 through an internal bus. For example, the IOH 2020 may be connected to the ICH 2030 through a direct media interface (DMI), a hub interface, an enterprise southbridge interface (ESI), PCIe, etc.

The ICH 2030 may provide various interfaces with peripheral devices. For example, the ICH 2030 may provide a universal serial bus (USB) port, a serial advanced technology attachment (SATA) port, a general purpose input/output (GPIO), a low pin count (LPC) bus, a serial peripheral interface (SPI), Peripheral Component Interconnect (PCI), PCIe, etc. According to an embodiment, two or more components of the processor 2010, the IOH 2020, or the ICH 2030 may be implemented as a single chip set.

Figure 15:
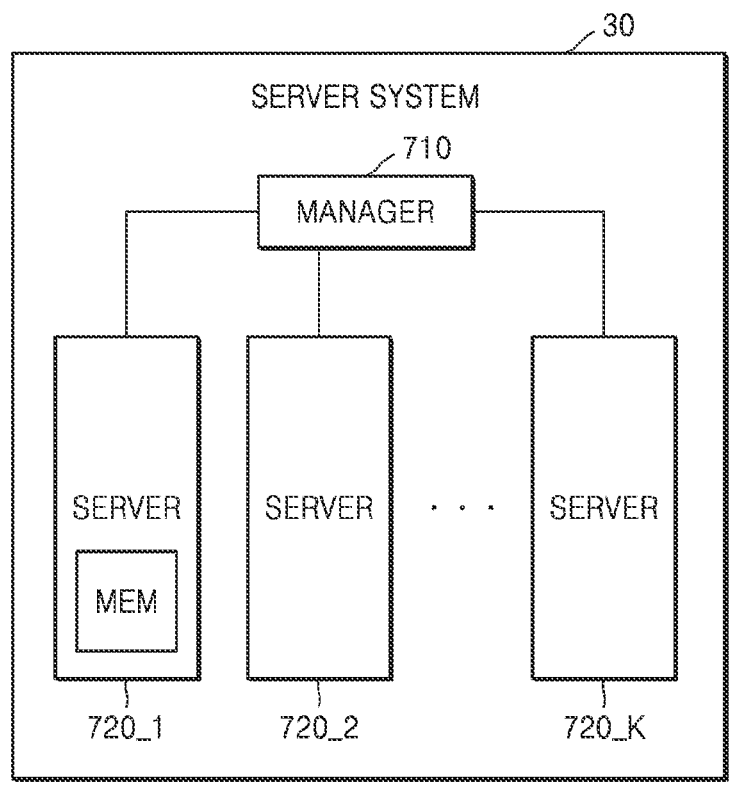
FIG. 15 is a block diagram of a server system including a storage system according to an example embodiment.

FIG. 15 is a block diagram of a server system 700 including a storage system according to an embodiment.

Referring to FIG. 15, the server system 700 may include a manager 710 and a plurality of servers including first to K-th servers 720_1 to 720_K. Each of the plurality of servers including first to K-th servers 720_1 to 720_K may include a computing system including the aforementioned host and storage system. The plurality of servers including first to K-th servers 720_1 to 720_K may be connected to each other through a bus supporting a certain protocol (e.g., PCI, PCIe, etc.). In an embodiment, the plurality of servers including first to K-th servers 720_1 to 720_K may communicate with each other through a peer-to-peer (P2P) connection based on the control by the manager 710.

The first server 720_1 may include a host and one or more memory devices (MEM) according to the above-described embodiments, perform various types of arithmetic processing according to functions of the server, and store the processing results. According to an embodiment, a memory device may perform an on-die ECC operation in response to a normal read command, and may output original data, on which an on-die ECC operation is not performed, in response to an uncorrected read command. Accordingly, the generation of an error which may not be detected due to an on-die ECC operation may be prevented, and an error bit that may not be corrected by an on-die ECC operation may be directly corrected by the first server 720_1.

As is traditional in the field of the inventive concept, embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, etc., which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions.

While the inventive concept has been particularly shown and described with reference to embodiments thereof, it will be understood that various changes in form and detail may be made therein without departing from the spirit and scope of the inventive concept as defined by the following claims.

What is claimed is:

1. A memory device, comprising:
   a memory cell array comprising a normal region in which first data is stored and a parity region in which a parity bit for the first data is stored;
   an error correction code (ECC) engine configured to determine whether there is an error in the first data, based on the first data and the parity bit,
   wherein the ECC engine is further configured to output, in response to receiving an uncorrected read command from a memory controller, second data in a state in which an error bit in the first data is not corrected;
   a plurality of pins connected to the memory controller; and
   a command decoder configured to separately receive a normal read command and the uncorrected read command based on at least one of the plurality of pins,
   wherein the normal read command is configured to correct the error bit in the first data,
   wherein the ECC engine is further configured to generate corrected data by correcting the error bit and output the second data instead of the corrected data, in response to receiving a control signal based on the uncorrected read command from the command decoder.

2. The memory device of claim 1, wherein the at least one of the plurality of pins comprises a command/address (CA) pin.

3. The memory device of claim 1, wherein the first data comprises 128 bits, and the parity bit comprises 8 bits.

4. The memory device of claim 3, wherein the ECC engine is further configured to generate corrected data obtained by correcting the error bit, in response to the normal read command.

5. The memory device of claim 3, wherein a burst length of the memory device is 16,
   the plurality of pins comprise eight data input/output pins,
   the first data is divided into four units of data based on the data input/output pins and the burst length,
   the error bit is one of first and second error bits in any one unit of data of the four units of data, and
   the ECC engine miscorrects the first and second error bits in response to the normal read command.

6. The memory device of claim 1, wherein the ECC engine is further configured to bypass an error correction operation on the first data and directly output the second data, in response to receiving a control signal based on the uncorrected read command from the command decoder.

7. The memory device of claim 1, further comprising:
   a volatile memory device.

8. The memory device of claim 7, wherein the volatile memory device operates at 4 bits (×4) or 8 bits (×8).

9. A memory device, comprising:
   a memory cell array comprising a normal region in which first data is stored and a parity region in which a parity bit for the first data is stored;
   an error correction code (ECC) engine configured to determine whether there is an error in the first data, based on the first data and the parity bit,
   wherein the ECC engine is further configured to output, in response to receiving an uncorrected read command from a memory controller, second data in a state in which an error bit in the first data is not corrected;
   a plurality of pins connected to the memory controller; and
   a command decoder configured to separately receive a normal read command and the uncorrected read command based on at least one of the plurality of pins,
   wherein the normal read command is configured to correct the error bit in the first data,
   wherein the at least one of the plurality of pins comprises a don't care pin of the normal read command.

10. A memory device, comprising:
    a memory cell array comprising a normal region in which first data is stored and a parity region in which a parity bit for the first data is stored;
    an error correction code (ECC) engine configured to determine whether there is an error in the first data, based on the first data and the parity bit,
    wherein the ECC engine is further configured to output, in response to receiving an uncorrected read command from a memory controller, second data in a state in which an error bit in the first data is not corrected;
    a plurality of pins connected to the memory controller; and
    a command decoder configured to separately receive a normal read command and the uncorrected read command based on at least one of the plurality of pins,
    wherein the normal read command is configured to correct the error bit in the first data,
    wherein the ECC engine comprises a syndrome generator configured to calculate syndrome data based on the first data and the parity bit, and
    the syndrome generator is further configured to always output the syndrome data as a first value, in response to receiving a control signal based on the uncorrected read command from the command decoder.

11. The memory device of claim 10, wherein the first value comprises zero.

12. A memory device, comprising:
    a memory cell array comprising a normal region in which first data is stored and a parity region in which a parity bit for the first data is stored; and
    an error correction code (ECC) engine configured to determine whether there is an error in the first data, based on the first data and the parity bit,
    wherein the ECC engine is further configured to output, in response to receiving an uncorrected read command from a memory controller, second data in a state in which an error bit in the first data is not corrected, wherein the ECC engine is further configured to:

receive a plurality of uncorrected read commands from the memory controller at a first cycle interval, wherein the uncorrected read command is one of the plurality of uncorrected read commands;

output the first data stored in the normal region, in response to each of the plurality of uncorrected read commands; and read all of the first data stored in the normal region within a first period, in response to the plurality of uncorrected read commands.

* * * * *